(12) United States Patent
Trivedi

(10) Patent No.: US 6,440,799 B1
(45) Date of Patent: Aug. 27, 2002

(54) SEMICONDUCTOR STRUCTURES, METHODS OF IMPLANTING DOPANTS INTO SEMICONDUCTOR STRUCTURES AND METHODS OF FORMING CMOS CONSTRUCTIONS

(75) Inventor: Jigish D. Trivedi, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/881,308

(22) Filed: Jun. 13, 2001

(51) Int. Cl.$^7$ ................ H01L 21/8242; H01L 21/336
(52) U.S. Cl. ............... 438/268; 438/286; 438/253; 438/255
(58) Field of Search ................... 438/253, 255, 438/268, 286, 396, 397, 586, 592

(56) References Cited

U.S. PATENT DOCUMENTS

| | | | | |
|---|---|---|---|---|
| 3,873,313 A | * | 3/1975 | Horst et al. ................. | 430/166 |
| 4,439,516 A | * | 3/1984 | Cernigliaro et al. .......... | 430/166 |
| 4,701,390 A | * | 10/1987 | Grunwald et al. ........... | 430/324 |
| 4,762,768 A | * | 8/1988 | Grunwald et al. ........... | 430/324 |
| 4,806,455 A | * | 2/1989 | LaBianca .................... | 427/425 |
| 6,033,952 A | | 3/2000 | Yasumura et al. | |

OTHER PUBLICATIONS

Elian, K et al "Comparative evaluation of electron–beam senstivie signle layer top surface imaging and bilayer chemical amplification of resist lines process for stencil mask making", Journal of Vacuum Science, Nov. 1999, B 17 (6), 3122–3126.*

Sezi, Recai et al "High Performance Resists Tailored for 248 nm Chemical Amplification of Resist Lines Technology", Japanese Journal of Applied Physics, Part 1 (1991), 30 (11B), 3108–3115.*

Watanabe, H. et al., "Novel 0.44$\mu$m$^2$ Ti–Salicide STI Cell Technology for High–Density NOR Flash Memories and High Performance Embedded Application", IEEE 1998, pp. 36.2.1–36.2.4.

Wolf, S., "Silicon Processing for the VLSI Era", vol. 2, pp. 632–635.

Mitsubishi Electric Website: Reprinted from website http://www.mitsubishielectric.com/r and d/tech showcase/ts8.php on Mar. 29, 2001: "8. Production Line Application of a Fine Hole Pattern–Formation Technology for Semiconductors", on Mar. 29, 2001, 4 pgs.

Cahners Semiconductor International Website: Reprinted from http://www.semiconductor.net/semiconductor/issues/1999/sep99/docs/feature1.asp on Mar. 29, 2001: "Resists Join the Sub-$\lambda$ Revolution", 9 pgs.

Cahners Semiconductor International Website: Reprinted from http://www.semiconductor.net/semiconductor/issues/1999/aug99/docs/lithography.asp on Mar. 29, 2001: "Paths to Smaller Features", 1 pg.

* cited by examiner

Primary Examiner—Michael S. Lebentritt
(74) Attorney, Agent, or Firm—Wells St. John P.S.

(57) ABSTRACT

The invention includes a method of implanting dopants into a semiconductor structure wherein a lateral periphery of a photoresist mask is shifted after implanting a first dopant and prior to implanting a second dopant. The invention also includes semiconductor structures having two doped regions of a semiconductive material separated by a region less heavily doped than the doped regions.

38 Claims, 9 Drawing Sheets

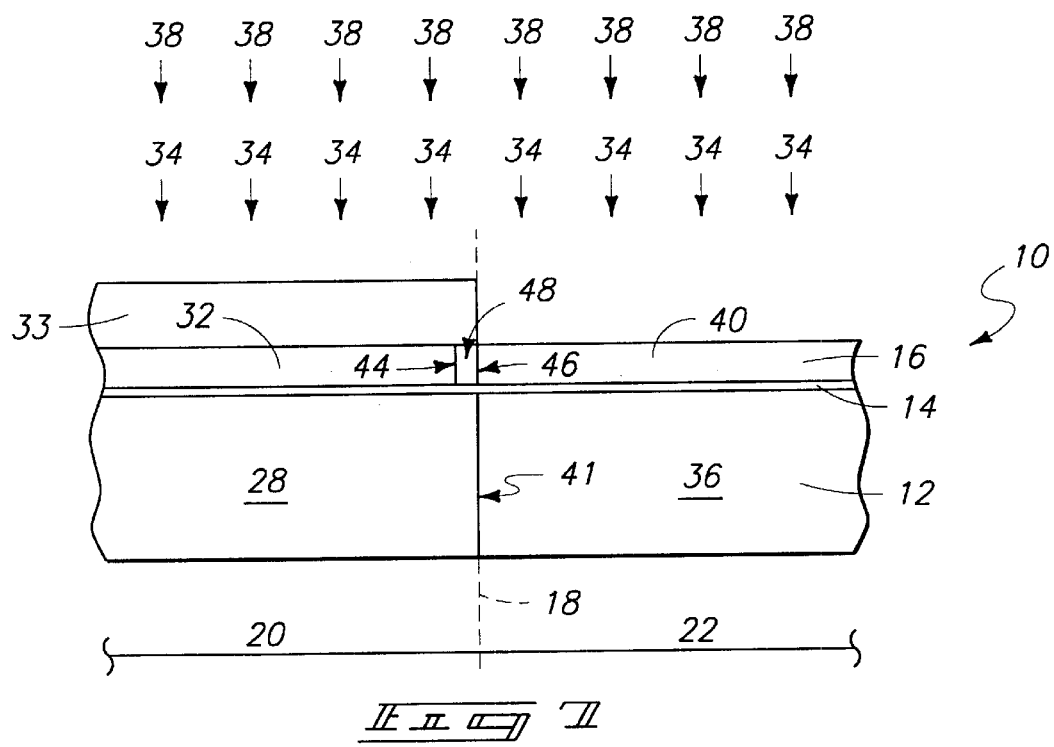
_FIG. 7_
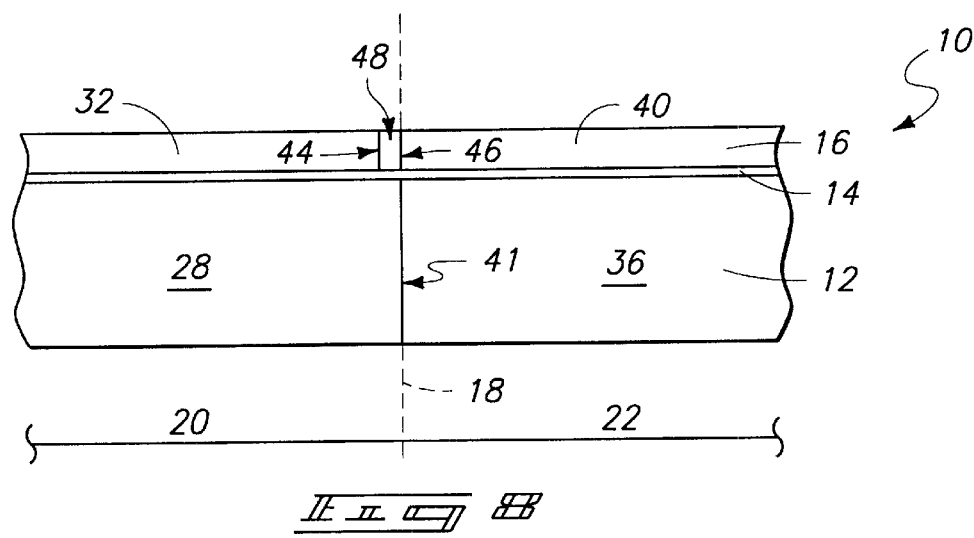
_FIG. 8_

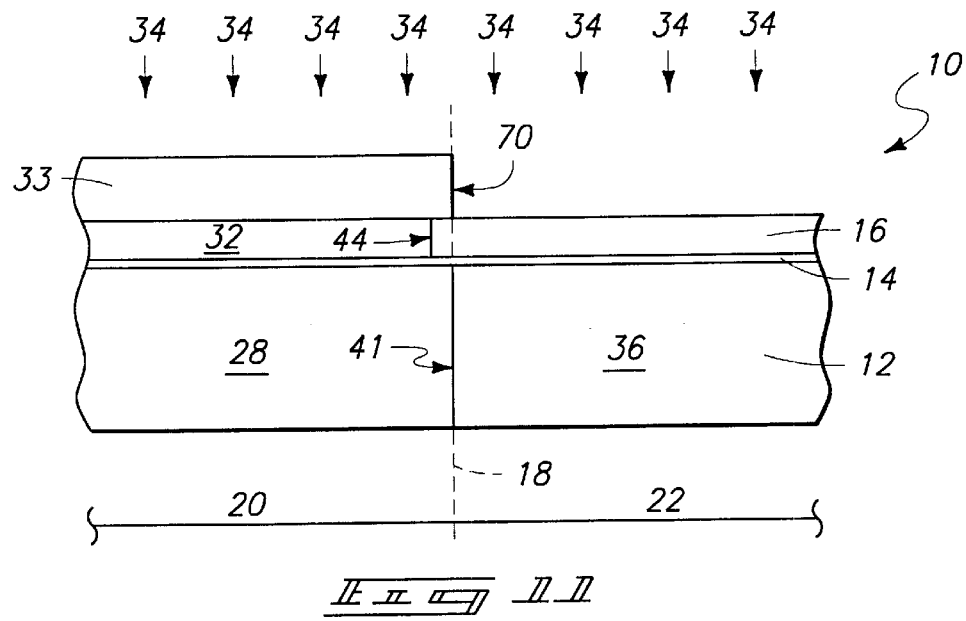
F I G. 11
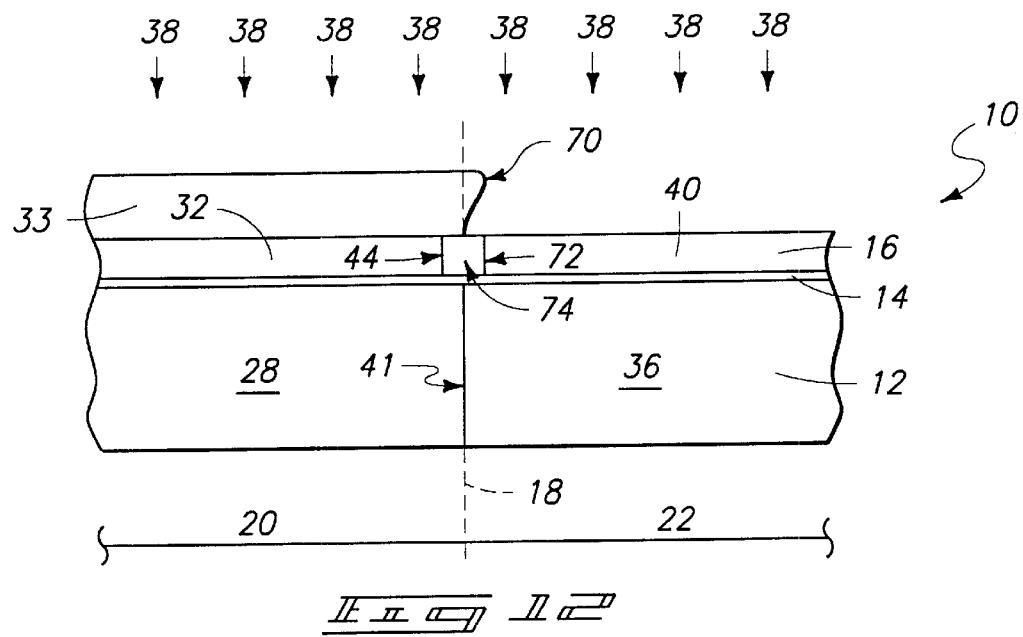
F I G. 12

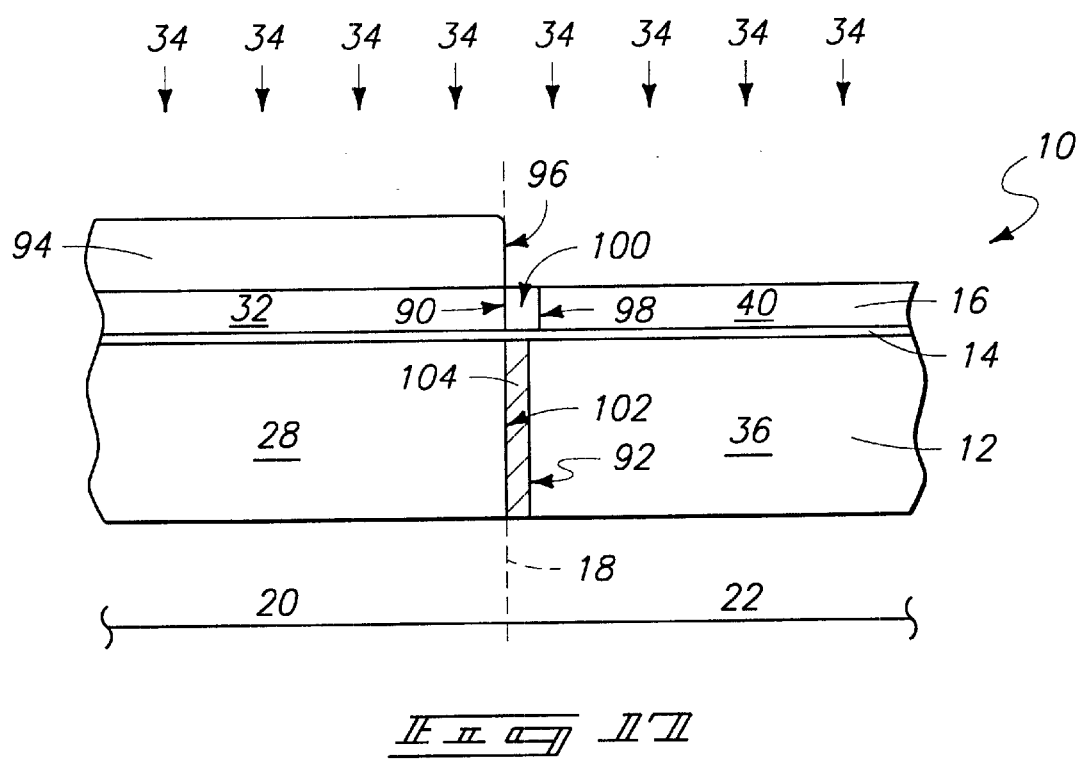

SEMICONDUCTOR STRUCTURES, METHODS OF IMPLANTING DOPANTS INTO SEMICONDUCTOR STRUCTURES AND METHODS OF FORMING CMOS CONSTRUCTIONS

TECHNICAL FIELD

The invention pertains to methods of implanting dopants into semiconductor structures, and in particular embodiments pertain to methods of forming CMOS constructions. The invention also pertains to semiconductor structures.

BACKGROUND OF THE INVENTION

It is common for semiconductor structures to comprise p-channel devices adjacent n-channel devices. For instance, static random access memory (SRAM) and logic devices frequently comprise p-channel transistor devices adjacent n-channel transistor devices, or in other words frequently comprise PMOS devices adjacent NMOS devices. A construction comprising PMOS and NMOS devices can be referred to as a CMOS construction.

A prior art method for fabricating a CMOS construction is described with reference to FIGS. 1–4. Referring initially to FIG. 1, a fragment 10 of a semiconductor construction is illustrated. Fragment 10 comprises a substrate 12 having a dielectric material 14 and a semiconductive material 16 provided thereover. Substrate 12 can comprise, for example, monocrystalline silicon; dielectric material 14 can comprise, for example, silicon dioxide; and semiconductive material 16 can comprise, for example, either amorphous or polycrystalline silicon.

For purposes of the discussion that follows, the semiconductive material of substrate 12 can be referred to as a first semiconductive material, and the semiconductive material 16 can be referred to as a second semiconductive material. Additionally, fragment 10 can be referred to as a semiconductor structure. To aid in interpretation of the claims that follow, the terms "semiconductive substrate" and "semiconductor substrate" are defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

A dashed line 18 subdivides fragment 10 into a pair of defined regions 20 and 22, with one of the regions ultimately being utilized for PMOS constructions and the other of the regions ultimately being utilized for NMOS constructions. Dashed line 18 can be considered an imaginary boundary segregating regions 20 and 22 from one another.

Referring to FIG. 2, semiconductor fragment 10 is illustrated in top view, wherein it is shown that semiconductive material 16 and dielectric material 14 are patterned into the shape of a line (dielectric material 14 is not visible in the view of FIG. 2), with such line extending across regions 20 and 22. It is noted that the line can extend entirely across regions 20 and 22, or can extend only partially across one or both of regions 20 and 22. Semiconductive material 16 can ultimately be utilized to form gates for transistor devices associated with regions 20 and 22.

Referring to FIG. 3, a photoresist mask 24 is shown formed over region 22, while leaving region 20 uncovered. Mask 24 can be formed by photolithographic processing methods. Specifically, mask 24 can be formed by initially providing a layer of photoresist across both regions 20 and 22, and subsequently exposing the photoresist to a patterned beam of radiation. The patterned beam of radiation selectively exposes the photoresist over one of regions 20 and 22 to the radiation, while leaving the photoresist over the other of regions 20 and 22 not exposed. A solvent can then be utilized to selectively remove the photoresist from over region 20, while leaving the photoresist over region 22. The photoresist utilized for forming mask 24 can be either positive photoresist or negative photoresist, and accordingly it can be either the portion over region 20 which is selectively exposed to radiation, or the portion over region 22 which is selectively exposed to radiation.

After patterned mask 24 is formed, fragment 10 is exposed to a first dopant implant. The dopant of the first implant is illustrated by downwardly extending arrows 26. The dopant can be either n-type or p-type conductivity-enhancing dopant, and can be implanted to be primarily within either substrate 12 or semiconductive material 16 of region 20. For instance, if region 20 is ultimately to comprise a PMOS device, dopant 26 can comprise n-type conductivity-enhancing dopant and can be implanted to form an n-type doped region 28 within substrate 12.

A second dopant 30 is implanted after the implant of first dopant 26, and is provided to be primarily in either semiconductive material substrate 12 or semiconductive material 16; and will be provided to be primarily in whichever of materials 12 and 16 did not primarily contain the implant of dopant 26. Accordingly, if dopant 26 was primarily directed into semiconductive substrate 12, dopant 30 will be primarily directed into semiconductive material 26 to form an implant 32 within material 26. If region 20 is ultimately to be utilized for forming a PMOS device, implant 32 can comprise p-type dopant.

It is to be understood that dopants 26 and 30 can both be implanted into both of semiconductive substrate 12 and semiconductive material 16; however, the dopants will typically be implanted to a heavier concentration in one of either the substrate 12 or material 16 than in the other of the substrate 12 and material 16. In the shown embodiment, first dopant 26 is implanted to a heavier concentration in semiconductive substrate 12 than in semiconductive material 16, and second dopant 30 is implanted to a heavier concentration in semiconductive material 16.

Mask 24 protects region 22 from receiving either of dopants 26 or 30 therein.

Referring to FIG. 4, patterned mask 24 (FIG. 3) is removed, and a second patterned mask 33 is formed. Mask 33 covers region 20, while leaving region 22 exposed. Mask 33 can be formed by processing similar to that described above with reference to mask 24.

After mask 33 is formed, a first dopant 34 is implanted into region 22. Dopant 34 can be either an n-type or p-type dopant, and can be provided primarily into either semiconductive substrate 12 or semiconductive material 16. If region 22 is ultimately to be utilized for forming an NMOS device, dopant 34 can comprise p-type dopant, and can be provided primarily into semiconductive substrate 12 to form a doped region 36.

After the implant of dopant 34, a second dopant 38 is implanted into region 22. Second dopant 38 is directed into whichever of semiconductive material 16 and semiconductive substrate 12 did not primarily receive the implant of first dopant 34. Accordingly, in the shown embodiment dopant 38 can be utilized to form an implant region 40 within semiconductive material 16. If region 22 is ultimately to be utilized for forming an NMOS device, dopant 38 can comprise an n-type dopant, and can accordingly be utilized to dope semiconductive material 16 of region 22 to n-type conductivity type.

A solid boundary replaces dashed line 18 within semiconductive material 16 and substrate 12 of FIGS. 3 and 4 to indicate that a border extends along the line 18 within materials 16 and 12. The border within material 16 delineates a boundary where dopant regions 32 and 40 meet; and the border within substrate 12 delineates a boundary where dopant regions 28 and 36 meet.

A problem which can occur during the prior art processing of FIGS. 1–4 is that dopant can migrate between doped regions 32 and 40 during subsequent thermal processing of fragment 10. For instance, if region 32 is a p-type doped region and region 40 is an n-type doped region, it is found that n-type dopant from region 40 can migrate into region 32 and change the electrical characteristics of semiconductive material 16 within region 20, and/or that p-type dopant from region 32 can migrate into region 40 and change the electrical characteristics of semiconductive material 16 within region 22. Such change in electrical characteristics can alter performance of electrical devices formed within regions 20 or 22, and even render such devices inoperable. It would be desirable to develop semiconductor fabrication technologies which alleviate or prevent dopant diffusion between regions 32 and 40 of semiconductive material 16.

SUMMARY OF THE INVENTION

In one aspect, the invention encompasses a method of implanting dopant into a semiconductor structure. A semiconductor structure is provided comprising a first semiconductive material and a second semiconductive material over the first semiconductive material. The structure further comprises a defined first region and a defined second region adjacent the first region. A photoresist mask is formed over the first region, and subsequently a first dopant is implanted into at least one of the first and second semiconductive materials of the second region. After the first dopant is implanted, a second dopant is implanted into at least one of the first and second semiconductive materials of the second region while at least some of the photoresist mask remains over the first region. The photoresist mask has a periphery at a first location of the semiconductor structure during the implanting of the first dopant, and such periphery is shifted to a second location prior to implanting of the second dopant.

In other aspects, the invention encompasses methods of formation of CMOS constructions; and in yet other aspects the invention encompasses semiconductor structures.

BRIEF DESCRIPTION OF THE DRAWINGS

Preferred embodiments of the invention are described below with reference to the following accompanying drawings.

FIG. 7 is a view of the FIG. 5 wafer fragment shown at a processing step subsequent to that of FIG. 6.

FIG. 8 is a view of the FIG. 5 wafer fragment shown at a processing step subsequent to that of FIG. 7.

FIG. 11 is a cross-sectional view of a wafer fragment shown at a processing step subsequent to that of FIG. 6 in accordance with a second embodiment method of the present invention.

FIG. 12 is a view of the FIG. 11 wafer fragment shown at a processing step subsequent to that of FIG. 11.

FIG. 17 is a view of the FIG. 14 wafer fragment shown at a processing step subsequent to that of FIG. 16.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 4:
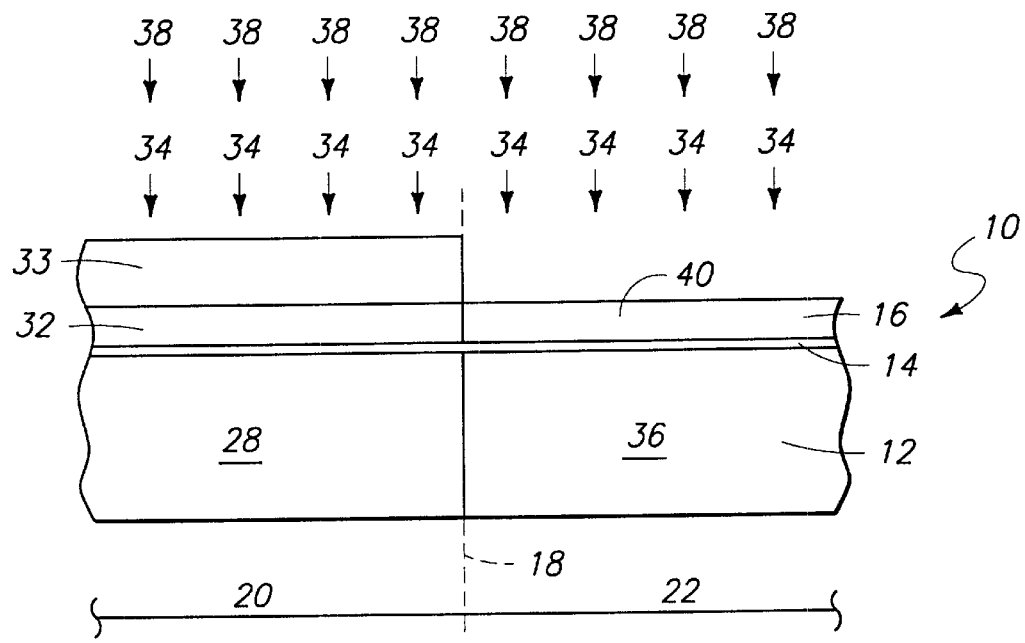
FIG. 4 is a view of the FIG. 1 wafer fragment shown at a prior art processing step subsequent to that of FIG. 3.

In one aspect, the invention encompasses a recognition that the problem of dopant migration between regions 32 and 40 (FIG. 4) that was discussed above in the "Background" section of this disclosure can be alleviated if an undoped region is utilized to separate the implant regions 32 and 40. One embodiment of the present invention is described with reference to FIGS. 5–10. In referring to FIGS. 5–10, identical numbering will be utilized as was used in describing the prior art of FIGS. 1–4.

Figure 1:
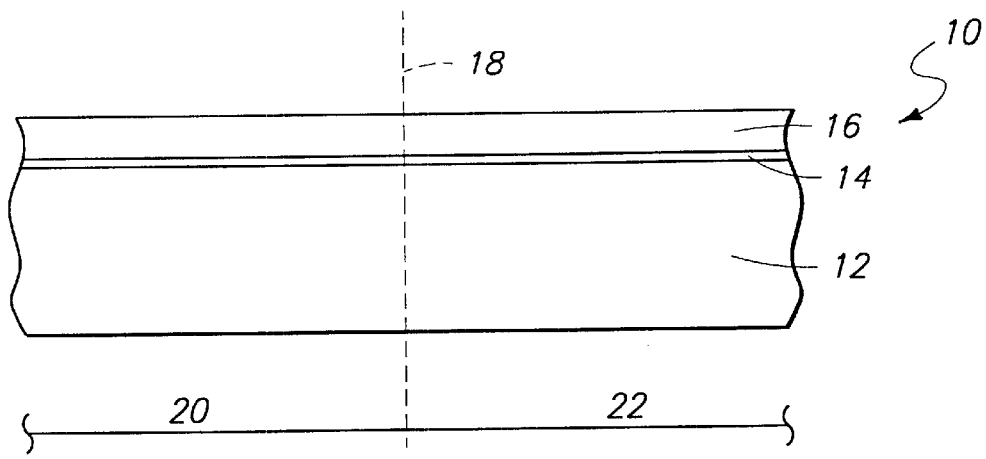
FIG. 1 is a diagrammatic, cross-sectional view of a semiconductor wafer fragment at a preliminary step of a prior art processing method.
Figure 2:
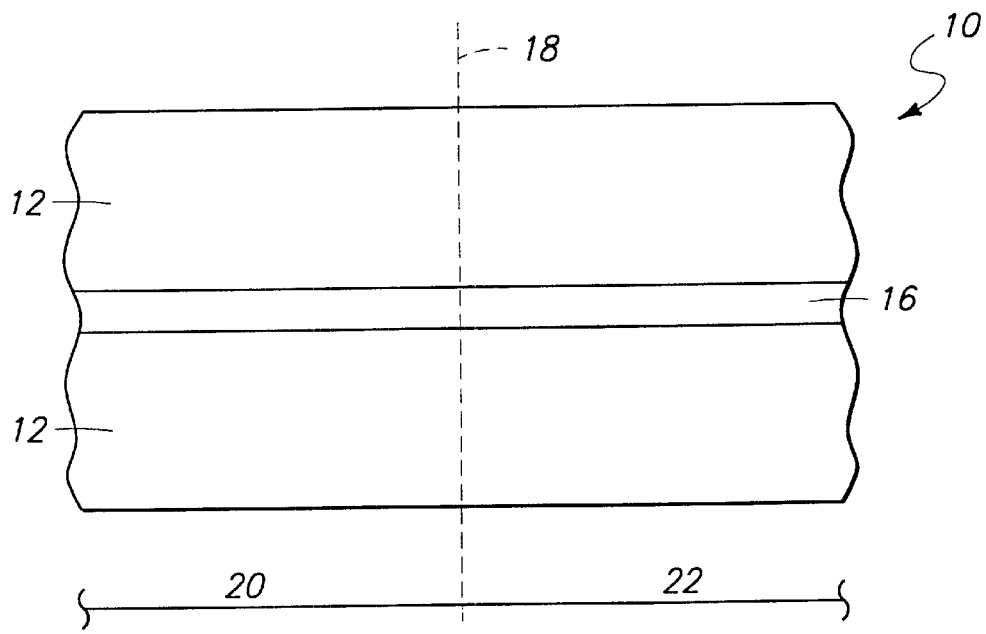
FIG. 2 is a view of the FIG. 1 wafer fragment shown at a prior art processing step subsequent to that of FIG. 1.
Figure 3:
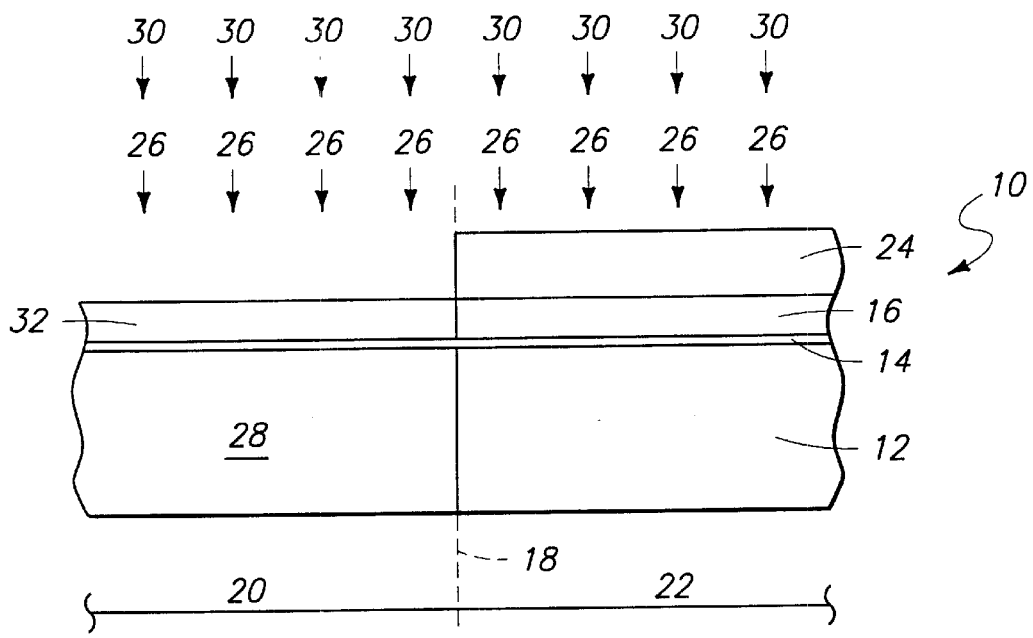
FIG. 3 is a view of the FIG. 1 wafer fragment shown at a prior art processing step subsequent to that of FIG. 2.
Figure 5:
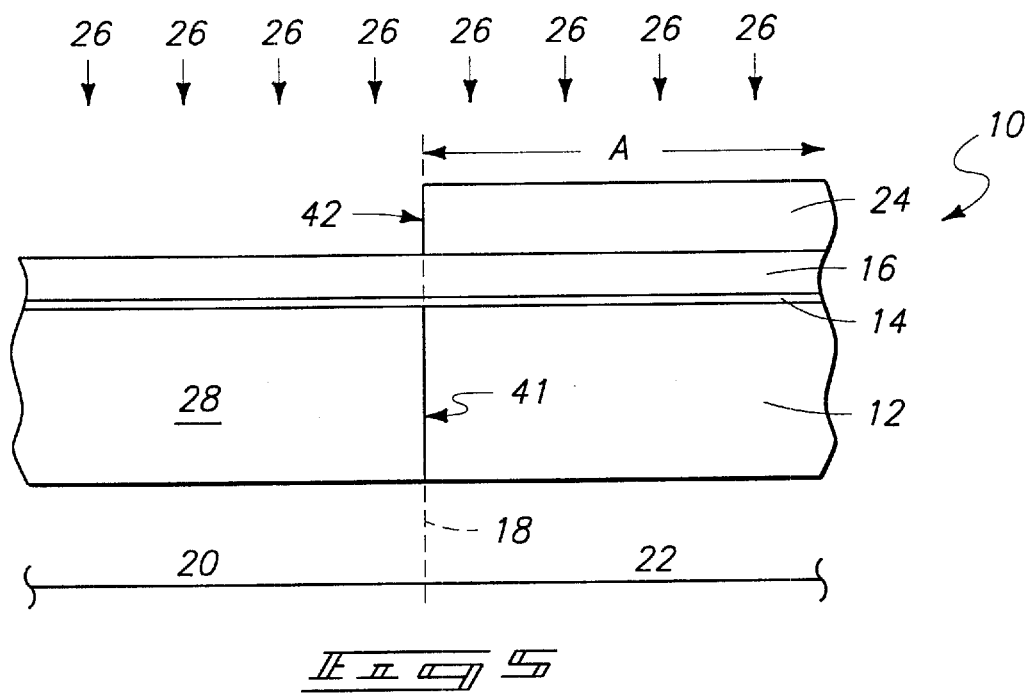
FIG. 5 is a cross-sectional view of a wafer fragment shown at a processing step subsequent to that of FIG. 1 in accordance with a first embodiment method of the present invention.

FIG. 5 illustrates semiconductor wafer fragment 10 at a processing step subsequent to that of FIG. 1, and shows patterned masking layer 24 provided over region 22. First dopant 26 is shown being implanted into region 22, and in the shown embodiment forms region 28 within substrate 12. Dopant 26 is preferably primarily provided into either semiconductive material 16 or substrate 12, and in the shown embodiment is provided at sufficient energy to penetrate through semiconductive material 16 and into semiconductive material 12. Dopant 26 can comprise either n-type or p-type dopant (as discussed above with reference to FIG. 3), and in a particular embodiment can comprise n-type dopant for forming an n-type portion 28 of semiconductive substrate 12 within region 20. A boundary 41 is shown overlapping dashed line 18 within substrate 12, and such boundary marks an edge of implant region 28.

The photoresist mask 24 of FIG. 5 has a lateral edge 42 which defines the location of boundary 41 thereunder. Additionally, photoresist mask 24 has a lateral dimension "A" extending from lateral periphery 42 to an opposing lateral edge (not shown in the fragmentary view of FIG. 5).

Figure 6:
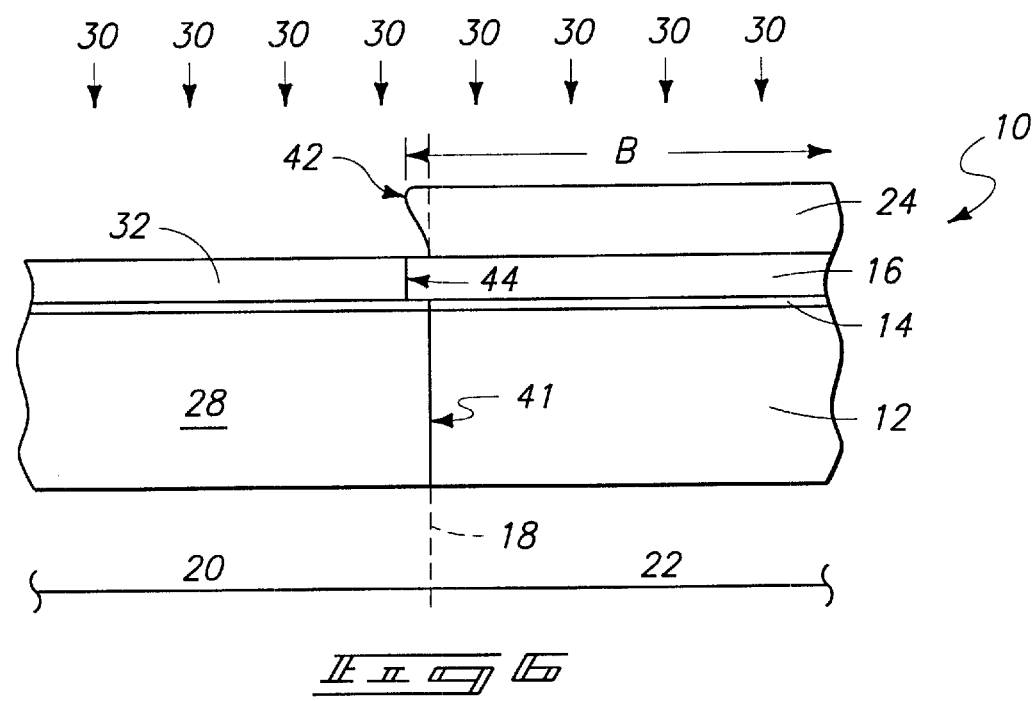
FIG. 6 is a view of the FIG. 5 wafer fragment shown at a processing step subsequent to that of FIG. 5.

Referring to FIG. 6, the photoresist of mask 24 is modified to shift lateral periphery 42 from the location of FIG. 5 (aligned with dashed line 18) to a new location outward of the first location. Such shift of lateral periphery 42 changes the dimension of photoresist 24 from "A" (FIG. 5) to a longer dimension "B".

After the shift of lateral periphery 42, the second dopant 30 is implanted into region 20 to form implant region 32 in semiconductive material 16. Dopant 30 can comprise either n-type or p-type dopant, and will typically comprise an opposite conductivity-type dopant than the first dopant 26 (FIG. 5). If region 20 is ultimately to be utilized for supporting a PMOS device, dopant 30 can comprise p-type dopant; and accordingly implant region 32 can comprise a p-type doped region of semiconductive material 16. Implant region 32 comprises a boundary 44 defined by the outermost location of lateral periphery 42. Boundary 44 is shifted relative to boundary 41 due to the shift of lateral periphery 42 between the implants of dopants 26 and 30.

The modification of photoresist mask 24 shown in FIG. 6 can be accomplished by, for example, heating the photoresist to a temperature of at least about 130° C., and preferably from about 130° C. to about 160° C. Such temperature can cause volatile materials to exit from photoresist mask 24, and accordingly lead to a collapse of resist pattern 24 and formation of a bulge at lateral periphery 42. The heating of resist 24 is but one method for accomplishing a shift of lateral periphery 42, and it is to be understood that the invention encompasses other methods of shifting such lateral periphery.

Referring to FIG. 7, photoresist mask 24 (FIG. 6) is removed, and subsequently a photoresist mask 33 is provided over region 20. Photoresist mask 33 can be formed using conventional methods, and in the shown embodiment is formed identically to the mask utilized in the prior art processing described with reference to FIG. 4. After formation of mask 33, dopants 34 and 38 are implanted to form doped portions 36 and 40 of region 22 in processing which can be identical to that described above with reference to FIG. 4.

In referring to the structure of FIG. 7, it is noted that doped regions 28 and 36 of semiconductive substrate 12 share the common boundary 41, while doped region 40 has a boundary 46 which is spaced from the boundary 44 of doped region 32. An undoped region 48 extends between boundaries 44 and 46, and such undoped region can alleviate or prevent dopant diffusion between implant regions 32 and 40. Specifically, undoped region 48 can effectively be a sponge for soaking up dopant that would otherwise migrate between regions 32 and 40. Further, region 48 provides a physical separation between a rightmost edge of implant region 32 and a leftmost edge of implant region 40 which requires dopant to migrate an additional distance before cross-contamination of regions 32 and 40 can occur. A distance between boundaries 44 and 46 will preferably be at least 50 nanometers (nm), and can be, for example, in the range of from about 25 nm to about 500 nm. Although region 48 is referred to as an "undoped" region, it is to be understood that region 48 can alternatively be considered as a region of material 16 that is less heavily doped than adjacent regions 32 and 40. Region 48 will preferably be less heavily doped than either of regions 32 and 40.

Figure 9:
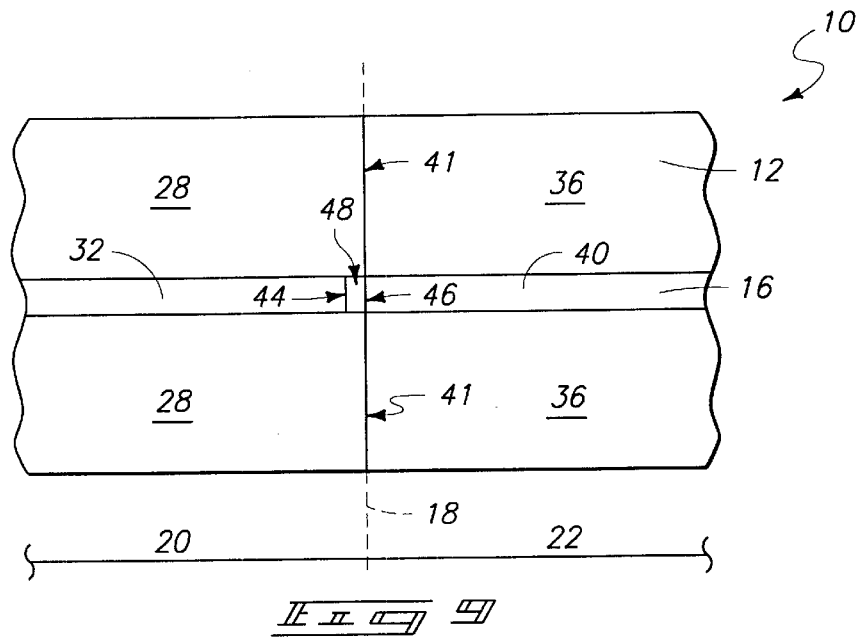
FIG. 9 is a top view of the FIG. 8 wafer fragment, and shown at the same processing step as FIG. 8.

FIGS. 8 and 9 illustrate a cross-sectional side view and top view, respectively, of the structure of FIG. 7 shown after removal of photoresist mask 33 (FIG. 7); and show the separation between implant regions 32 and 40 achieved by undoped portion 48. Regions 32 and 40 can be described as a first doped portion of material 16 and a second doped portion of material 16, respectively, which are separated from one another by the undoped portion 48 of material 16.

Figure 10:
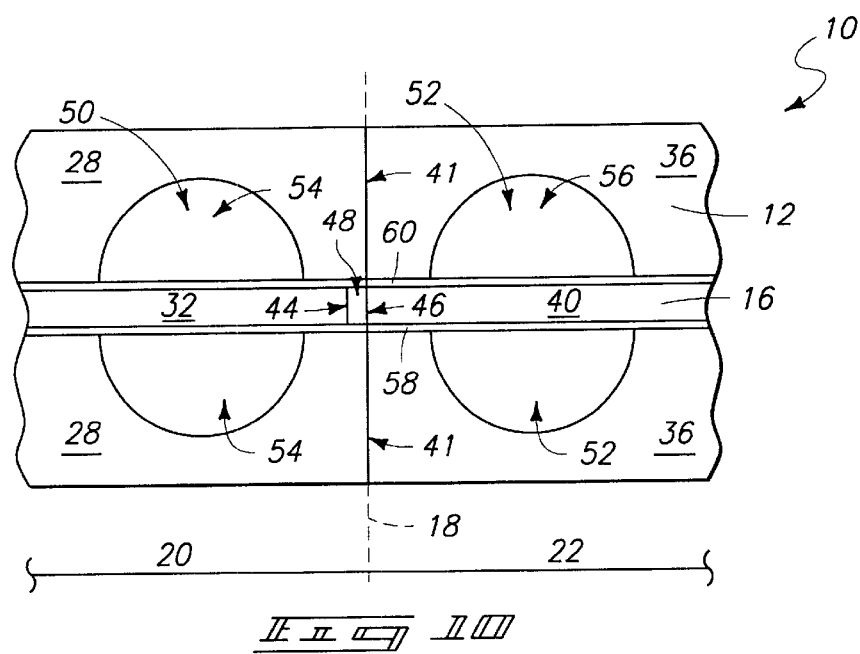
FIG. 10 is a top view of the FIG. 9 wafer fragment, and shown at a processing step subsequent to that of FIG. 9.

FIG. 10 illustrates formation of transistor device structures 50 and 52 within regions 20 and 22, respectively. Specifically, source/drain regions 54 are provided within substrate 12 and proximate doped portion 32 of semiconductive material 16. Also, source/drain regions 56 are provided within region 22 and proximate doped portion 40 of semiconductive material 16. Isolation regions (not shown), such as, for example, shallow trench isolation regions, would typically be provided within substrate 12 prior to formation of source/drain regions 54 and 56, and would electrically isolate the source/drain regions from other conductively-doped portions of substrate 12.

Source/drain regions 54 and 56 can comprise p-type or n-type dopant. In embodiments in which region 20 is utilized for formation of a PMOS device, source/drain regions 54 would comprise a heavy concentration of p-type dopant (with the term "heavy" referring to a concentration of at least about $1\times10^{19}$ atoms/cm$^3$). Also, if region 22 corresponds to an NMOS device region, source/drain regions 56 would comprise a heavy concentration of n-type dopant.

Undoped portion 48 of semiconductive material 16 defines a region which is electrically non-conductive relative to the doped portions 32 and 40. In order to provide an electrical path across undoped portion 48, conductive straps 58 and 60 are provided along lateral edges of material 16. Conductive straps 58 and 60 can comprise, for example, metal silicide and/or elemental metal. If straps 58 and 60 comprise metal silicide, suitable materials are tungsten silicide and titanium suicide.

Although conductive straps 58 and 60 are shown along lateral edges of conductive material 16, it is to be understood that straps 58 and 60 can also be formed along other surfaces of conductive material 16, such as, for example, an upper surface of material 16. Also, although two conductive straps are shown, with the straps being along opposing lateral sidewalls of conductive material 16, it is to be understood that the invention encompasses embodiments wherein only one conductive strap is provided.

The processing described above with reference to FIGS. 5–10 is one embodiment of the present invention. In such embodiment, a lateral periphery of a photoresist mask 24 (FIGS. 5 and 6) was shifted between the implants of a pair of dopants into region 20 of wafer fragment 10, but a lateral periphery of a different photoresist mask (33 of FIG. 7) was left unchanged during an implant of a pair of dopants into region 22. FIGS. 11 and 12 illustrate an alternative embodiment of the present invention wherein the lateral periphery of mask 33 is shifted between the implant of first and second dopants into region 22. In referring to FIGS. 11 and 12, the same numbering is utilized as was used above in describing the embodiment of FIGS. 5–10.

FIG. 11 illustrates wafer fragment 10 at a processing step subsequent to that of FIG. 6 and shows photoresist mask 33 provided over region 20. Dopant 34 Is implanted into region 22 to form implant region 36 within semiconductive substrate 12. Photoresist mask 33 comprises a lateral periphery 70 along imaginary boundary line 18 and accordingly region 36 is formed to share the same border 41 as does region 28.

FIG. 12 shows photoresist mask 33 after treatment with suitable conditions to outwardly shift lateral periphery 70. Such conditions can comprise, for example, the heating described above with reference to FIG. 6. After lateral periphery 70 is shifted, second conductivity-enhancing dopant 38 is implanted into semiconductive material 16 to form conductive portion 40. Conductive portion 40 has a border 72 defined by an outermost edge of lateral periphery 70, assuming that implant 38 is provided at an angle perpendicular to an upper surface of material 16.

Borders 44 and 72 are separated by an undoped region 74. Undoped region 74 is wider than the region 48 formed by the processing of FIGS. 5–8, due to the combined effect of shifting lateral peripheries of both of the photoresist masks 24 and 33, rather than only one of such lateral peripheries in the embodiment of FIGS. 5–10. The additional width of undoped region 74 attained by the processing of FIGS. 11 and 12 can be advantageous in particular embodiments of the present invention, such as, for example, in embodiments in which fragment 10 will be subjected to processing conditions which can diffuse dopant across long distances, such as, for example, processing conditions comprising one or both of high temperatures and long durations.

The embodiments of FIGS. 5–12 illustrate a method of shifting the lateral periphery of a photoresist mask wherein the mask is heated to form a bulge. Other methods can be utilized for shifting the lateral periphery of a photoresist mask.

Figure 13:
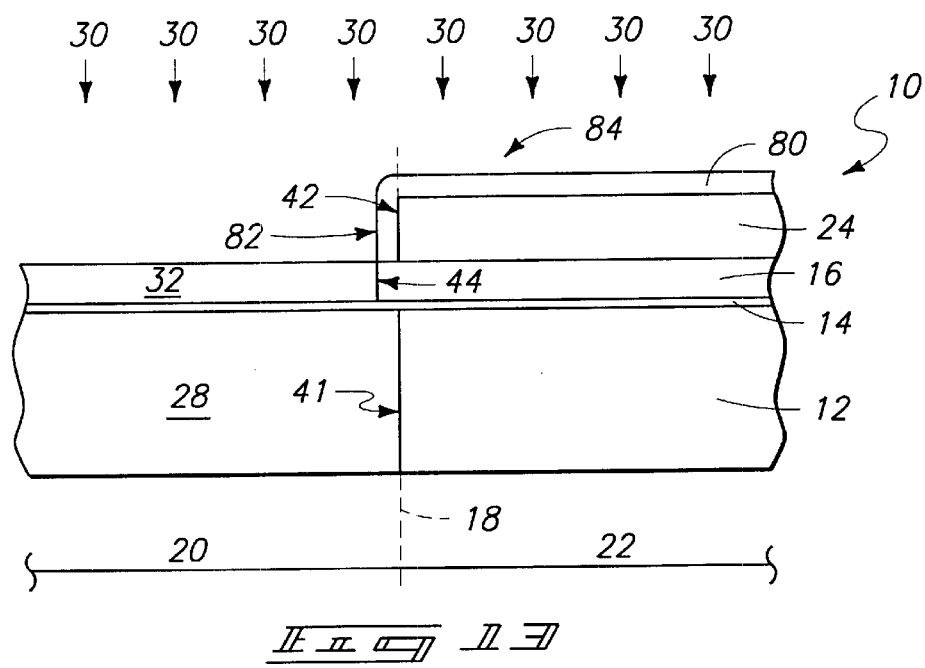
FIG. 13 is a cross-sectional view of a wafer fragment shown at a processing step subsequent to that of FIG. 5 in accordance with a third embodiment method of the present invention.

FIG. 13 illustrates an alternative embodiment process for shifting a lateral periphery of a mask. The wafer fragment 10 of FIG. 13 is illustrated at a processing step subsequent to that of FIG. 5, and is shown with identical numbering to that utilized in describing FIGS. 5 and 6. Photoresist mask 24 has a first lateral periphery 42 which was utilized during formation of doped portion 28 of semiconductive material 12 (see FIG. 5). Subsequently, a coating 80 is provided over photoresist mask 24 to define a second lateral periphery 82 which is outwardly extended from first lateral periphery 42. Coating 80 and photoresist mask 24 together define a second mask 84 having a lateral periphery outwardly shifted relative to the lateral periphery of the first mask (with photoresist 24 alone corresponding to the first mask).

Coating 80 can comprise, for example, the material referred to as AZ R200™ available from Clariant International, Ltd. Such coating can be formed by providing the AZ R200™ material over an entire upper surface of fragment 10, baking the AZ R200™ at a temperature of from about 100° C. to about 120° C. to crosslink the layer of AZ R200™ across resist block 24; and selectively removing excess and uncross-linked AZ R200™ with the solution marketed as SOLUTION C™ by Clariant International, Ltd.

After formation of coating 82, dopant 30 is implanted to form doped region 32 having the border 44 shifted relative to imaginary boundary 18 and border 41.

The processing of FIG. 13 is similar to that of FIGS. 5–12 in that it accomplishes a shift of a lateral periphery of a mask without photolithographic processing. Such can be advantageous in semiconductor fabrication methods, in that it can avoid process steps associated with photolithographic processing, and can further avoid problems associated with potential mask misalignment that can occur whenever additional photolithograph processing steps are incorporated into a fabrication sequence.

Each of the embodiments of FIGS. 5–13 involves shifting a lateral periphery of a mask outwardly from an initial location to a new location, with the term "outwardly" indicating that a dimension of the mask is increased. FIGS. 14–17 illustrate an embodiment of the invention in which a lateral periphery of a mask is shifted inwardly (i.e., in which a dimension of the mask decreases).

Figure 14:
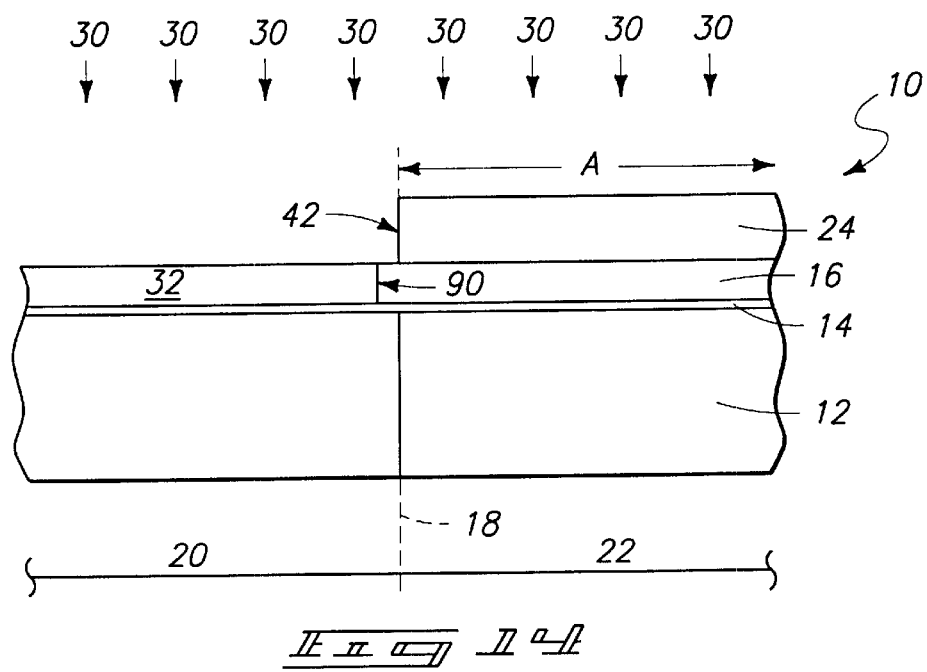
FIG. 14 is a cross-sectional view of a wafer fragment shown at a processing step subsequent to that of FIG. 1 in accordance with a fourth embodiment method of the present invention.

Referring to FIG. 14, wafer fragment 10 is shown at a processing step similar to that of FIG. 5, except that dopant 30 is being implanted to form doped region 32 of semiconductive material 16, rather than implanting dopant 26 to form doped portion 28 of semiconductive substrate 12. In other words, the sequence of implanting dopants 26 and 30 (FIGS. 5 and 6) is reversed, and dopant 30 is being implanted first. Fragment 10 of FIG. 14 comprises photoresist mask 24 over region 22. Photoresist mask 24 has a lateral periphery 42, and a lateral dimension "A". Lateral periphery 42 defines a border 90 of implant region 32 thereunder. Border 90 is along imaginary boundary 18.

Figure 15:
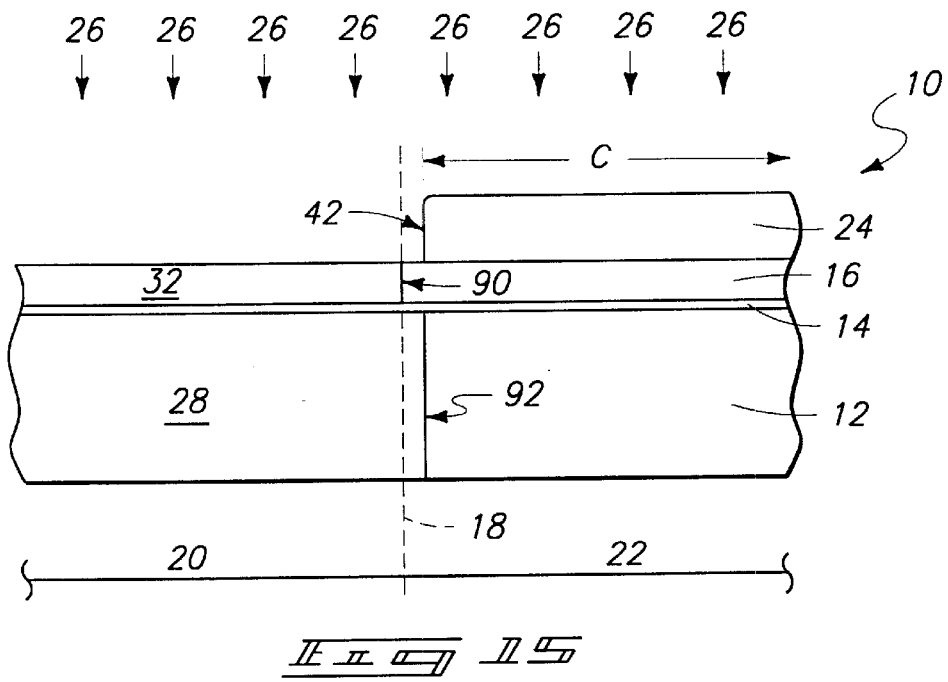
FIG. 15 is a view of the FIG. 14 wafer fragment shown at a processing step subsequent to that of FIG. 14.

Referring to FIG. 15, photoresist mask 24 is treated by appropriate conditions which remove some of the photoresist mask and thereby shift lateral periphery 42 inwardly. Such shift reduces the lateral dimension "A" of mask 24 to a new value "C". Suitable conditions for reducing a size of resist 24 can comprise, for example, rinsing of resist 24 in a developer solution. Specifically, resist 24 will initially have been patterned by exposing a portion of resist 24 to light, and subsequently utilizing a developer solvent to selectively remove either the portion exposed as light or the portion not exposed to the light. The developer solution will be utilized for a particular duration. If patterned photoresist 24 is exposed to the same developer solution after the implant of dopant 30 (FIG. 14), such can remove some of the photoresist. Alternatively, other solvents can be utilized for removing some of the photoresist.

After lateral periphery 42 is shifted inwardly, dopant 26 is implanted to form doped portion 28 of semiconductive substrate 12. Doped portion 28 has a border 92 defined by shifted lateral periphery 42 of mask 24.

Figure 16:
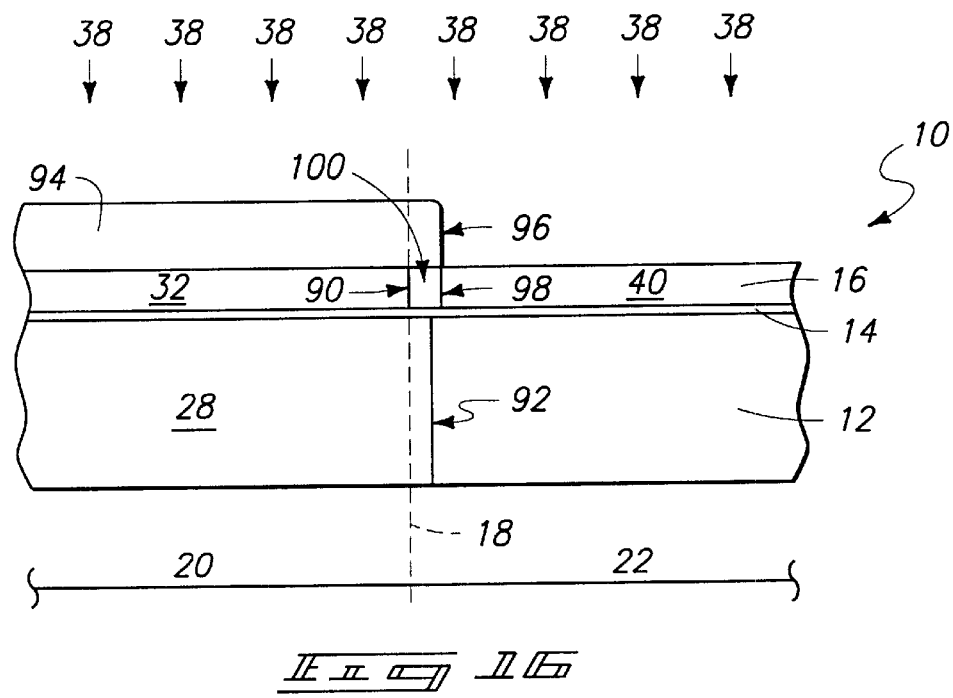
FIG. 16 is a view of the FIG. 14 wafer fragment shown at a processing step subsequent to that of FIG. 15.

Referring to FIG. 16, photoresist mask 24 (FIG. 15) is removed, and a patterned photoresist mask 94 is formed over region 20 of fragment 10. Photoresist mask 94 is similar to the mask 33 described with reference to FIGS. 5–12, but differs in having a lateral periphery 96 extending beyond boundary 18. After formation of patterned mask 94, dopant 38 is implanted to form doped portion 40 of semiconductive material 16. Doped portion 40 has a border 98 defined by lateral periphery 96 of mask 94. An undoped portion of semiconductive material 16 extends between borders 90 and 98.

Referring to FIG. 17, photoresist mask 94 is subjected to suitable processing to remove some of the mask, and accordingly shift lateral periphery 96. The conditions for removing some of mask 94 can be the same as those described above with reference to FIG. 15 for removing some of mask 24. After lateral periphery 96 is shifted, dopant 34 is implanted to form doped portion 36 of semiconductive substrate 12. Doped portion 36 has a border 102 which is shifted relative to the border 92 of doped portion 98. Accordingly, there is a region 104 between borders 102 and 92 which comprises both of the dopants of portions 36 and 28. If regions 36 and 28 comprise opposite-type conductivity dopants relative to one another (i.e., if one of regions 28 and 36 comprises n-type dopant and the other comprises p-type dopant), region 104 can comprise a conductivity type associated with either region 28 or 36 by providing one of regions 28 and 36 with sufficient dopant to overwhelm the dopant associated with the other region. For instance, if region 28 comprises n-type dopant and region 36 comprises p-type dopant, and if it is desired to have region 104 ultimately have p-type characteristics, region 36 can be provided with a dopant concentration at least tenfold, and preferably at least a hundredfold, larger than the dopant concentration utilized in region 28; and such will result in region 104 having characteristics dominated by the p-type dopant.

Although the masks 24, 33 and 94 are described above as being photoresist masks, it is to be understood that other masking materials can be utilized.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A method of implanting dopant into a semiconductor structure, comprising:

providing a semiconductor structure comprising a first semiconductive material and a second semiconductive material over the first semiconductive material; the structure comprising a defined first region and a defined second region adjacent the first region;

forming a photoresist mask over the first region and implanting a first dopant into at least one of the first and second semiconductive materials of the second region; the photoresist mask having a periphery at a first location of the semiconductor structure during the implanting of the first dopant; and after implanting the first dopant, shifting the photoresist mask periphery to a second location and subsequently implanting a second dopant into at least one of the first and second semiconductive materials of the second region while at least some of the photoresist mask remains over the first region.

2. The method of claim 1 wherein the first semiconductive material is monocrystalline, and wherein the second semiconductive material is either amorphous or polycrystalline.

3. The method of claim 2 wherein the first and second semiconductive materials comprise silicon.

4. The method of claim 1 wherein the first dopant is a different conductivity type than the second dopant.

5. The method of claim 1 wherein the first dopant is implanted to a heavier dose in one of the first and second semiconductive materials of the second region than in an other of the first and second semiconductive materials of the second region; and wherein the second dopant is implanted to a heavier dose is said other of the first and second semiconductive materials of the second region than in said one of the first and second semiconductive materials of the second region.

6. The method of claim 1 wherein the shifting the periphery of the photoresist mask comprises removing some of the photoresist of the mask from the periphery.

7. The method of claim 1 wherein the shifting the periphery of the photoresist mask comprises removing some of the photoresist of the mask from the periphery with a solvent.

8. The method of claim 1 wherein the forming the photoresist mask comprises:

forming a blanket of photoresist over the first and second regions;

selectively exposing the photoresist over one of the first and second regions to radiation while not exposing the other of the first and second regions;

after the exposing, utilizing a solvent to selectively remove the photoresist from over the second region while leaving the photoresist over the first region; and wherein the shifting the periphery of the photoresist mask comprises removing some of the photoresist of the mask from the periphery with the same solvent that had been utilized to remove the photoresist from over the second region.

9. The method of claim 1 wherein the shifting the periphery of the photoresist mask comprises expanding an area occupied by the photoresist of the mask.

10. The method of claim 1 wherein the shifting the periphery of the photoresist mask comprises forming a coating on the photoresist mask.

11. A method of implanting dopant into a semiconductor structure, comprising:

providing a semiconductor structure comprising a defined first region and a defined second region adjacent the first region;

forming a photoresist mask over the first region, the photoresist mask comprising a first lateral dimension;

implanting a first dopant into the second region;

after implanting the first dopant, changing the lateral dimension of the photoresist mask without photolithographic processing; and after changing the lateral dimension of the photoresist mask, implanting a second dopant into the second region while at least some of the photoresist mask remains over the first region.

12. The method of claim 11 wherein the first dopant is a different conductivity type than the second dopant.

13. The method of claim 11 wherein the first dopant is p-type and the second dopant is n-type.

14. The method of claim 11 wherein the first dopant is n-type and the second dopant is p-type.

15. A method of implanting dopant into a semiconductor structure, comprising:

providing a semiconductor structure comprising a defined first region and a defined second region adjacent the first region;

forming a photoresist mask over the first region and implanting a first dopant into the second region; and after implanting the first dopant, shifting the photoresist mask periphery to a second location without photolithographic processing and subsequently implanting a second dopant into the second region while at least some of the photoresist mask remains over the first region.

16. The method of claim 15 wherein the first dopant is a different conductivity type than the second dopant.

17. The method of claim 15 wherein the first dopant is p-type and the second dopant is n-type.

18. The method of claim 15 wherein the first dopant is n-type and the second dopant is p-type.

19. A method of forming a CMOS construction, comprising:

providing a semiconductor structure comprising a first semiconductive material and a second semiconductive material over the first semiconductive material; the structure comprising a defined first region and a defined second region adjacent the first region; one of the first and second regions being an NMOS region and the other of the first and second regions being a PMOS region;

forming a mask over the first region and implanting a first conductivity-type dopant into at least one of the first and second semiconductive materials of the second region; the mask having a periphery at a first location of the semiconductor structure during the implanting of the first dopant; and after implanting the first dopant, shifting the mask periphery to a second location and subsequently implanting a second conductivity-type dopant into at least one of the first and second semiconductive materials of the second region while at least some of the photoresist mask remains over the first region; one of the first and second conductivity-type dopants being n-type and the other being p-type.

20. The method of claim 19 wherein the first dopant is implanted to a heavier dose in one of the first and second semiconductive materials than in an other of the first and second semiconductive materials; and wherein the second dopant is implanted to a heavier dose is said other of the first and second semiconductive materials than in said one of the first and second semiconductive materials.

21. The method of claim 19 wherein the first semiconductive material is monocrystalline, and wherein the second semiconductive material is either amorphous or polycrystalline.

22. The method of claim 19 wherein the mask comprises photoresist.

23. The method of claim 22 wherein the shifting the periphery of the photoresist mask comprises removing some of the photoresist of the mask from the periphery.

24. The method of claim 22 wherein the shifting the periphery of the photoresist mask comprises removing some of the photoresist of the mask from the periphery with a solvent.

25. The method of claim 22 wherein the forming the photoresist mask comprises:

forming a blanket of photoresist over the first and second regions;

exposing the photoresist over one of the first and second regions to radiation while not exposing the photoresist over the other of the first and second regions to the radiation; and after the exposing, utilizing a solvent to selectively remove the photoresist from over the second region while leaving the photoresist over the first region; and wherein the shifting the periphery of the photoresist mask comprises removing photoresist from the periphery with the same solvent that had been utilized to remove the photoresist from over the second region.

26. The method of claim 22 wherein the shifting the periphery of the photoresist mask comprises expanding an area occupied by the photoresist of the mask.

27. The method of claim 22 wherein the shifting the periphery of the photoresist mask comprises forming a coating on the photoresist mask.

28. The method of claim 19 further comprising:

removing the mask from over the first region;

forming a second mask over the second region and implanting a third conductivity-type dopant into at least one of the first and second semiconductive materials of the first region; the second mask having a periphery at a third location of the semiconductor structure during the implanting of the third dopant; and after implanting the third dopant, shifting the periphery of the second mask to a fourth location and subsequently implanting a fourth conductivity-type dopant into at least one of the first and second semiconductive materials of the first region while at least some of the photoresist mask remains over the second region; one of the third and fourth conductivity-type dopants being n-type and the other being p-type.

29. The method of claim 28 wherein the second mask comprises photoresist.

30. A method of forming a CMOS construction, comprising:

providing a semiconductor structure comprising a semiconductive material line extending over a semiconductive material substrate; the structure comprising a defined first region and a defined second region adjacent the first region; the line extending at least partially across both of the first and second regions; one of the first and second regions being an NMOS region and the other of the first and second regions being a PMOS region;

forming a mask over the first region; and implanting first and second conductivity-type dopants into the second region while the mask is over the first region; the first conductivity-type implant being directed primarily into the line, and the second conductivity-type implant being directed primarily into the substrate; a lateral periphery of the mask being moved between the implanting of the first and second conductivity-type dopants so that the first conductivity-type dopant is implanted to a different lateral periphery of the line than the second conductivity-type dopant is implanted in the substrate; one of the first and second conductivity-type implants being p-type and the other of the first and second conductivity-type implants being n-type.

31. The method of claim 30 wherein the first conductivity-type dopant is implanted before the second conductivity-type dopant.

32. The method of claim 30 wherein the line is ultimately formed with a first conductively-doped portion in the first region, a second conductively-doped portion in the second region, and an other portion extending between the first and second conductively-doped portions; said other portion being less heavily doped with conductivity-enhancing dopant than are the first and second conductively-doped portions; the method further comprising forming a conductive strap in electrical contact with the first and second conductively-doped portions and extending across said other portion of the line.

33. The method of claim 32 wherein the other portion is substantially undoped with conductivity-enhancing dopant.

34. The method of claim 32 wherein the first conductively-doped portion has a different conductivity type than the second conductively-doped portion.

35. The method of claim 32 wherein the first conductively-doped portion is p-type doped and the second conductively-doped portion is n-type doped.

36. The method of claim 32 wherein the first conductively-doped portion is n-type doped and the second conductively-doped portion is p-type doped.

37. The method of claim 32 further comprising:

incorporating at least a portion of the first conductively-doped portion into a PMOS transistor; and incorporating at least a portion of the second conductively-doped portion into an NMOS transistor.

38. The method of claim 30 further comprising:

removing the mask from over the first region; and forming a second mask over the second region and implanting first and second conductivity type dopants into the first region while the second mask is over the second region; the first conductivity-type implant being directed primarily into the substrate, and the second conductivity-type implant being directed primarily into the line; a lateral periphery of the second mask being moved between the implanting of the first and second conductivity-type dopants so that the first conductivity-type dopant is implanted to a different lateral periphery of the line than the second conductivity-type dopant is implanted in the substrate.

* * * * *

UNITED STATES PATENT AND TRADEMARK OFFICE
CERTIFICATE OF CORRECTION

PATENT NO.    : 6,440,799 B1
DATED         : August 27, 2002
INVENTOR(S)   : Jigish D. Trivedi It is certified that error appears in the above-identified patent and that said Letters Patent is hereby corrected as shown below:

Column 6,
Line 41, please replace "titanium suicide." with -- titanium silicide. --
Line 66, please replace "Is implanted into" with -- is implanted into --

Column 9,
Line 56, please replace "heavier dose is said other" with -- heavier dose in said other --

Column 11,
Line 23, please replace "heavier dose is said other" with -- heavier dose in said other --

Signed and Sealed this

Eighth Day of April, 2003

JAMES E. ROGAN
*Director of the United States Patent and Trademark Office*